United States Patent [19]

DeMichele

[11] 4,293,817
[45] Oct. 6, 1981

[54] SIGNAL AMPLITUDE RANGE COMPRESSION EMPLOYING PULSE MODULATION

[75] Inventor: Glenn A. DeMichele, Melbourne, Fla.

[73] Assignee: Rockwell International Corporation, El Segundo, Calif.

[21] Appl. No.: 74,642

[22] Filed: Sep. 12, 1979

[51] Int. Cl.³ .......................... H03G 7/00; H03L 5/00
[52] U.S. Cl. .................................... 328/169; 307/264; 328/175; 330/10; 333/14
[58] Field of Search ................ 307/264, 240; 328/169, 328/171, 172, 175; 330/10; 333/14

[56] References Cited

U.S. PATENT DOCUMENTS

| | | |
|---|---|---|
| 2,952,812 | 9/1960 | Klein, Jr. et al. .................... 328/172 |
| 3,564,394 | 2/1971 | Opal et al. ...................... 307/240 X |
| 3,963,992 | 6/1976 | Hekimian et al. ................. 330/10 X |

Primary Examiner—John Zazworsky
Attorney, Agent, or Firm—Terry M. Blackwood; Richard A. Bachand; H. Fredrick Hamann

[57] ABSTRACT

A compressor comprises a variable gain path and a feedback path. The variable gain path includes a modulator which, in response to an input signal and a feedback signal, outputs a train of pulses whose widths and heights are modulated. Also in the variable gain path, a demodulator converts the pulse train into a compressor output. Feedback is derived from the variable gain path.

1 Claim, 6 Drawing Figures

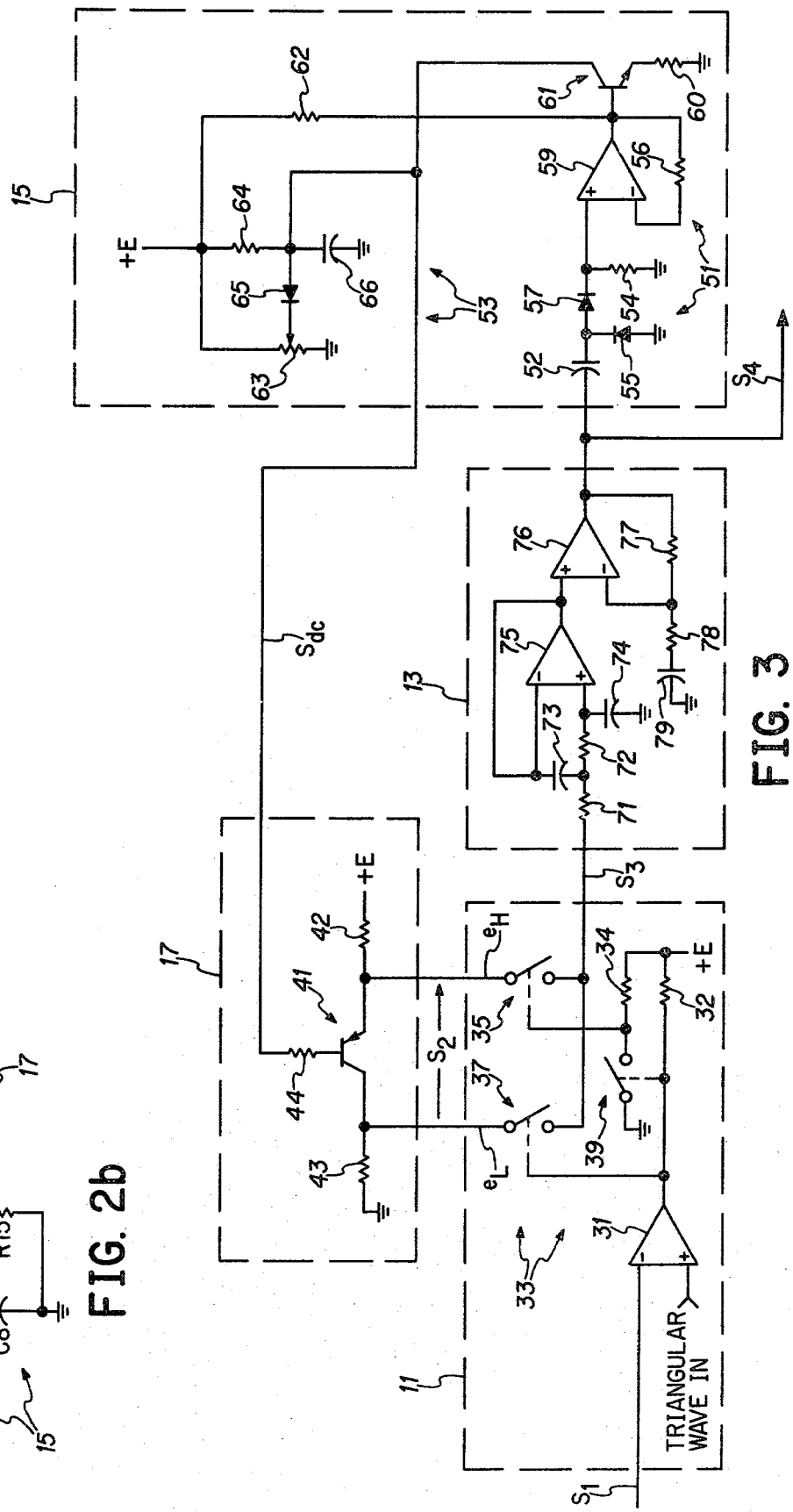
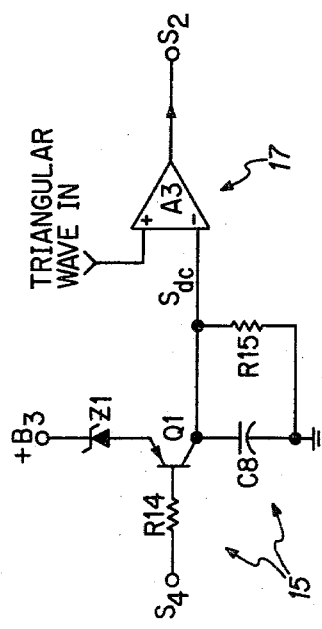
FIG. 2b
FIG. 3

SIGNAL AMPLITUDE RANGE COMPRESSION EMPLOYING PULSE MODULATION

The present invention relates generally to compression circuits and, in the preferred embodiment, to audio compression circuits.

As is well known in the art, compression is a process in which the effective gain applied to a signal is varied as a function of the signal magnitude, the effective gain being greater for small than for large signals. Thus, the output amplitude range is reduced relative to the input amplitude range. Prior art compression circuits have employed devices such as FETS, diodes, or opto-isolators, and have involved principles such as varying the bias on an active device or effecting changes in amplifier input impedance. See, for instance, U.S. Pat. Nos. 2,266,531, 3,109,993, 3,210,680, and 3,668,542.

In accordance with the present invention, there is featured the provision of new criteria for effecting compression, namely, using pulse width modulation and pulse height modulation for effecting compression. These and other features, objects, and advantages of the invention will become more apparent upon reference to the following specification, claims, and appended drawings in which:

FIG. 3 is a circuit diagram showing an early preferred implementation of the FIG. 1 apparatus.

Figure 1:
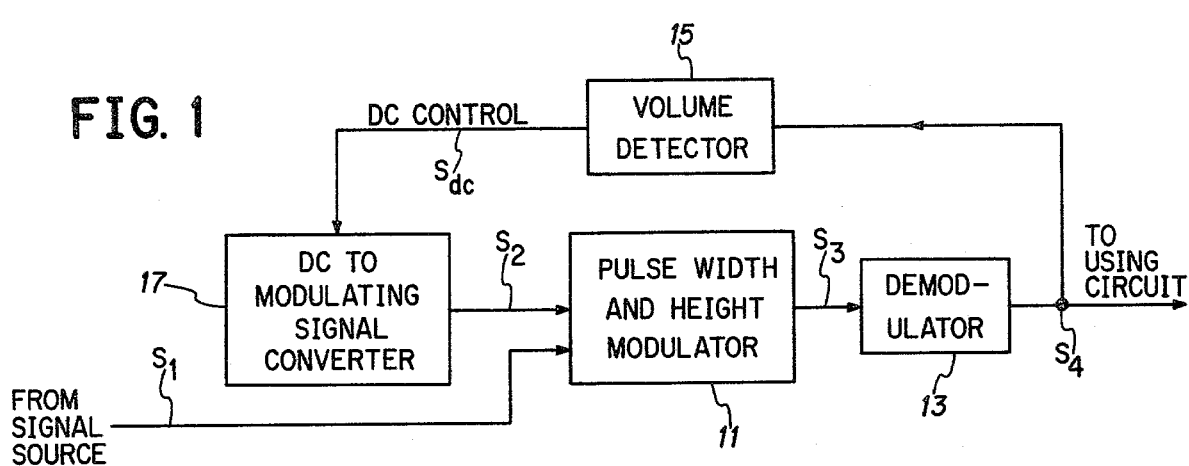
FIG. 1 is a block functional diagram representing the presently preferred inventive embodiment, FIG. 2a includes a circuit diagram showing a presently preferred implementation of the FIG. 1 apparatus and also includes waveforms useful in showing and explaining operation.

Referring now to FIG. 1, the input signal $S_1$ to the presently preferred compressor is typically an audio signal from a microphone or mic preamp, and output signal $S_4$ is a volume-compressed version of $S_1$. Under the influence of signals $S_1$ and $S_2$, where $S_2$ is a signal derived via feedback, modulator 11 outputs a signal $S_3$ containing the intelligence of $S_1$ but comprising a train of pulses whose widths and heights are modulated so as to effect gain control through control of the average value of the $S_3$ pulse train. Demodulator 13 eliminates the pulse waveform character of $S_3$ and outputs an audio signal $S_4$ which contains essentially the same intelligence of $S_1$. In the feedback path, volume detector 15 senses volume level of $S_4$ and, via converter 17 and $S_2$, causes either the $S_3$ pulse heights or the $S_3$ pulse widths to change so as to control the average value of the $S_3$ pulse train and thus the volume range of $S_4$.

Figure 2A:
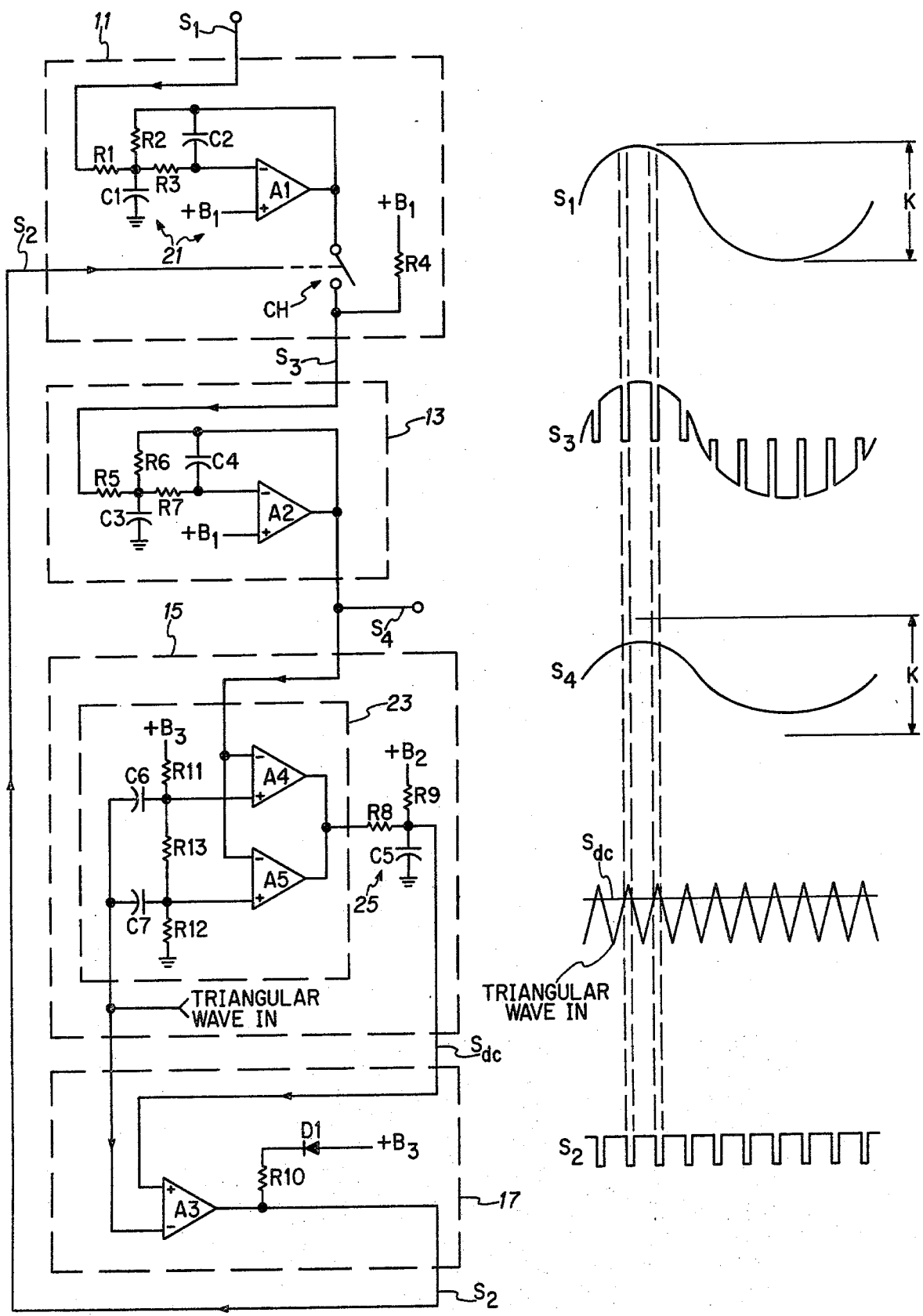
FIG. 2b is a circuit diagram showing a presently preferred alternative or substitute for items 15 and 17 of the FIG. 2a apparatus.

One presently preferred compressor implementation is shown in FIG. 2a. As may be seen therefrom, modulator 11 comprises a chopper CH, demodulator 13 comprises a low-pass filter, volume detector 15 comprises a "peak" or envelope detection circuit, and converter 17 comprises a comparator. As may also be seen from FIG. 2a, the preferred implementation therein shown also includes, preceding shopper CH, a low-pass filter 21 for reducing or substantially preventing aliasing and, in radio applications, for limiting the transmitted bandwidth. Hereinbelow, filter 21 is termed and shown as part of the FIG. 2a modulator section 11.

In operation, modulator 11 receives an audio signal $S_1$ and also converter output signal $S_2$, and outputs a train of pulses (namely $S_3$) whose heights are controlled by $S_1$ and whose widths are controlled by $S_2$. Expressed another way, $S_3$ is essentially $S_1$ but with holes chopped therein according to $S_2$. $S_3$ is filtered by low-pass filter 13 to produce a signal $S_4$ whose amplitude varies directly with the duty cycle of the chopper, where chopper duty cycle is defined as (time closed)/(time closed plus time open).

Detector 15 detects the peaks or envelope of $S_4$ and produces a dc control signal $S_{dc}$ whose amplitude decreases as the $S_4$ envelope exceeds a predetermined detector threshold level. In converter 17, detector output signal $S_{dc}$ is compared with a triangular wave so as to produce pulse train signal $S_2$ whose pulse widths correspond to the intervals where the triangular wave is greater than $S_{dc}$. $S_2$ controls chopper CH in modulator 11 so as to close chopper CH during $S_2$ pulses and so as to open chopper CH between $S_2$ pulses.

As indicated in FIG. 2a, $S_3$ retains the general character and intelligence of $S_1$ and is the result of $S_1$ being uniformly subjected to a gain factor which for the brief interval illustrated is essentially constant. It should be noted that the FIG. 2a waveforms represent a very short time interval and thus variations in $S_{dc}$, which are quite slow, do not appear in the FIG. 2a waveforms.

As is apparent from FIG. 2a, peak detector 15 is a full-wave device in the sense that not only is the triangular wave compared in 23 to the "positive" alternations of $S_4$, the triangular wave is also compared in 23 to the "negative" alternations of $S_4$. Thus the input to filter 25 is much the same as would come from a conventional, single op-amp comparator whose inputs comprised the triangular wave and a full-wave rectified version of $S_4$.

Resistor R9, in cooperation with capacitor C5, serves to control release time; i.e., to control, following $S_4$ becoming sufficiently small, the rate at which $S_{dc}$ can increase.

In converter 17, diode D1 is an LED which brightens as the $S_2$ pulses become narrower, thus visually indicating the amount of gain reduction.

Components and values used in the presently preferred FIG. 2a implementation include the following: R1=15 kohms; R2=R13=100 kohms; R3=6.8 kohms; R4=3.3 kohms; C1=0.015 uf; C2=220 pf; +B1=+7 volts dc; A1=A2=¼ of a type LM148 op-amp; CH is a type CD4066 analog switch; R5=R11=R12=33 kohms; R6=330 kohms; R7=10 kohms; C3=3700 pf; C4=220 pf; R8=1.2 kohms; R9=470 kohms; C5=2.0 uf; +B2=+5 volts dc; triangular wave peak-to-peak amplitude and frequency=4 volts and 60 kHz respectively; R10=1.5 kohms; +B3=+14 volts dc; A3=A4=A5=¼ of a LM139 quad comparator; C6=C7=0.1 uf.

During operation, $S_{dc}$ can move as high as +5 volts (i.e., +B2) and as low as zero volts. Thus, since the triangular wave at the A3 inverting input ranges only from zero to 4 volts, the $S_2$ duty cycle can take on any value from 0% to 100%.

Turning now to FIG. 2b, the apparatus therein shown comprises a presently preferred alternative circuit which may be directly substituted for items 15 and 17 in FIG. 2a. The FIG. 2b apparatus is considered a preferred implementation because it offers cost savings over the FIG. 2a items it replaces. Most or all such savings are, of course, a result of the changes in the volume detector 15 since both the FIGS. 2a and 2b converters 17 comprise identical comparators A3 merely having reversed inputs.

During operation of the FIG. 2b apparatus, as $S_4$ drops below 4.2 volts (i.e., $+B_3$-(zener voltage)-(transistor base-to-emitter voltage)=4.2 volts) or, in other words, as $S_4$ peak-to-peak exceeds 5.6 volts, transistor Q1 will conduct causing $S_{dc}$ to rise. The attack time, or rate of rise of $S_{dc}$, is controlled by the charging current through Q1 whereas in FIG. 2a the attack time is controlled by the resistance of R8. Release time in FIG. 2b is determined by R15 whereas release time in the FIG. 2a detector 15 is determined by R9. Capacitor C8 in FIG. 2b corresponds somewhat to C5 in FIG. 2a in the sense that both act as smoothing or filtering elements.

Components and values used in the FIG. 2b implementation include the following: R14=22 kohms; R15=270 kohms; C8=10 uf; Q1=2N2907; Z1=9.1 volt zener diode; $+B_3 = +14$ volts; $A3 = \frac{1}{4}$ of a LM139.

An earlier preferred compressor implementation is shown in FIG. 3. In this implementation, modulator 11 includes a comparator 31, which provides pulse width modulation, and also includes switching network 33 which affords amplitude modulation of the comparator emitted pulses. More specifically, in modulator 11, audio input signal $S_1$ is compared in 31 against a 100 kHz triangular wave to produce a 100 kHz pulse train at comparator 31 output, the individual pulse widths varying with $S_1$ and corresponding to intervals where $S_1$ exceeds the triangular wave. This comparator output then controls the switching network 33 so that between comparator pulses, switch 35 is closed and switches 37 and 39 are open, and during comparator pulses, switch 35 is open while switches 37 and 39 are closed. That is, $S_3$ tracks the comparator output pulse width variations but varies in amplitude between $e_L$ and $e_H$. Thus, receiving inputs $S_1$ and $S_2$, modulator 11 outputs a signal $S_3$ which comprises a train of pulses whose widths are controlled by $S_1$ and whose heights are controlled by $S_2$.

The $S_2$-producing converter 17 may be characterized as a phase splitter or balun type device. More particularly, $e_L$ and $e_H$ are voltages which both vary with $S_{dc}$ but which, in so doing are balanced about a constant level of approximately E/2. When $S_{dc}$ is at its lowest, $S_2$ (which is the transistor 41 emitter-to-collector voltage drop, or $e_H - e_L$) is approximately 0 and both $e_L$ and $e_H$ are approximately equal to E/2. As $S_{dc}$ increases, $e_L$ decreases from the E/2 level by some amount and $e_H$ increases from the E/2 level by a like amount, and thus $S_2$ increases. When $S_{dc}$ is at its highest, $e_H$ is about E volts, $e_L$ is about 0 volts and $S_2$ is about $E-0=E$ volts. This symmetry about the E/2 level prevents any dc level shift in $S_3$ when the $S_3$ peak-to-peak height changes.

Demodulator 13 comprises a second order butterworth low-pass filter having a 3 db cutoff frequency of about 4 kHz. Following the low-pass filter in demodulator 13 is an amplifier stage. The demodulator output $S_4$ is smoothly varying in amplitude, free of the pulse character of $S_3$ and is a volume-compressed version of $S_1$.

Volume detector 15 comprises a peak detector 51 and a threshold adjusting circuit 53. The two diodes 55 and 57 at the input of the peak detector clamp the negative peaks of $S_4$ to ground, and the peak-to-peak signal voltage appears at the positive input of amplifier 59. This makes the output of amplifier 59 rise above ground, and start to turn on transistor 61. The collector of transistor 61 then pulls the amplitude of $S_{dc}$ toward ground, which in turn decreases the gain of the compressor and reduces the signal level at the input of the peak detector. The maximum gain of the compressor gain control stage is limited by the threshold adjustment potentiometer 63 and the associated diode 65. Since $S_{dc}$ cannot exceed the voltage present at the wiper of potentiometer 63 because of the clamping action of the diode, the threshold adjustment circuit operates to limit the maximum value of $S_{dc}$, and thus to limit the maximum value of $S_2$, and thus to limit the gain of the variable gain portion of the compressor.

Components and values used in the FIG. 3 implementation include the following: triangular wave frequency and amplitude are respectively 100 kHz and 4 volts peak to peak; $+E = +16$ volts dc; resistor 60 is 56 ohms; resistors 32, 34, 42, 43, 44, 71, 72, 77, 78, 54, 56, 62, 64, are respectively in kilohms 2.2, 6.8, 1.0, 1.0, 100, 33, 33, 100, 5.6, 100, 100, 3.3, and 270; potentiometer 63 is 1000 ohms; capacitors 73, 74, 79, 52, and 66 are respectively in farads $1800 \times 10^{-12}$, $1000 \times 10^{-12}$, $0.18 \times 10^{-6}$, $4700 \times 10^{-12}$, and $15 \times 10^{-6}$; switches 35, 37, and 39, are each $\frac{1}{4}$ of a CD4066 analog switch; transistor 41 is a 2N2907; transistor 61 is a 2N2222A; diodes 55, 57, and 64 are each type 1N4454; comparators 31 and 59 are each $\frac{1}{4}$ of a LM139; amplifiers 75 and 76 are each $\frac{1}{4}$ of a LM148.

Note that varying the amplitude of the triangular wave into 31 just changes the effective gain or sensitivity of 31. That is, if the triangular wave is 4 volts peak-to-peak, a 4 volt peak-to-peak value of $S_1$ will fully pulse width modulate the output of 31. Whereas, if the triangular wave amplitude is reduced to, for example, 2 volts peak-to-peak, then it would only take 2 volts peak-to-peak on $S_1$ to fully modulate the output.

It should be apparent from the foregoing that one major advantage of the novel compressors arises from their particular and unique compatibility with class D modulators and switching power supplies. More particularly, elements such as a triangular wave generator may be shared or used by compressor and modulator and switching power supply. Also, tests have shown other improvements relative to conventional compressors. Namely, (1) gain versus control voltage is more linear, (2) compressor performance is more consistent over temperature variations, and (3) operating characteristics are more predictible and such consistency obviates test selection and parts screening in mass production.

Figure 4:
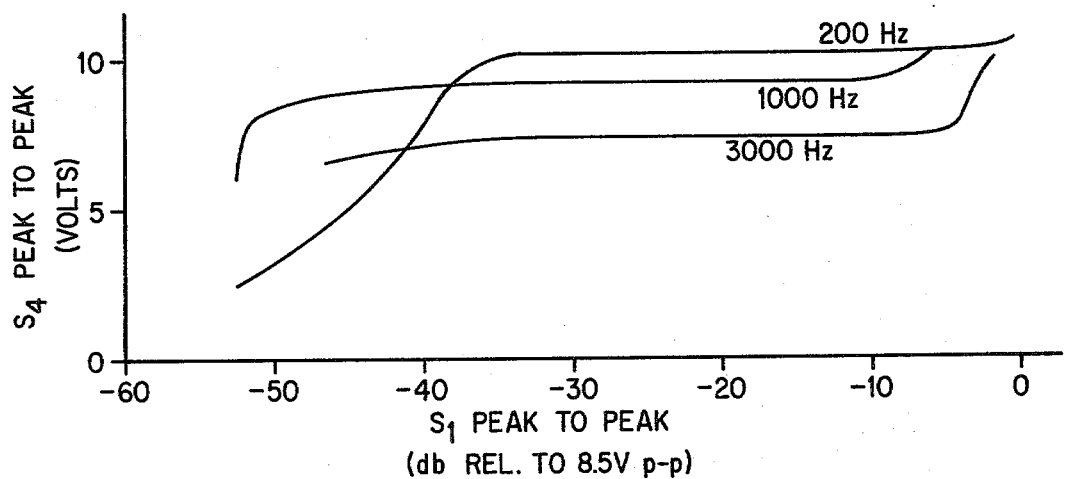
FIGS. 4 and 5 are curves representing actual test results.
Figure 5:
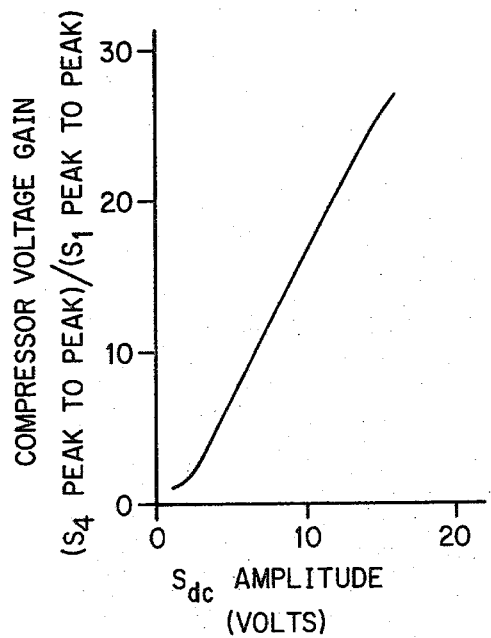

FIGS. 4 and 5 show some of the results in tests of the FIG. 3 apparatus. Specifically, FIG. 4 indicates volume out versus volume in for three different audio frequencies. In each case, the threshold adjustment is set for maximum gain. In all cases, the left-most knee, or onset of compression, may be moved to the right by adjusting the threshold so as to reduce the maximum value of $S_{dc}$. It should be noted that the different responses for the different frequencies is due entirely to the frequency response of the peak detector, and is not a shortcoming of the gain control method. FIG. 5 shows the linearity of the relationship between $S_{dc}$ and the variable gain of the compressor.

Referring back to FIGS. 1, 2a and 3, it should be noted that the input to the feedback path need not be from the demodulator 13 output. For instance, the $S_3$ waveform of FIG. 2a contains, although in a different form, the same output volume information as is contained in $S_4$. Thus, with an appropriately implemented volume detector 15, the input thereto could be $S_3$. For the FIG. 2a (or FIG. 3) types of compressor apparatus, one appropriate volume detector implementation for receiving $S_3$ directly could be merely the illustrated envelope detector but preceded by a low-pass filter substantially identical to that used for demodulator 13. In other words, two low-pass filters would be used, one as shown in the variable gain path, and an additional one preceding the peak detector. Another FIG. 2a volume detector implementation receiving $S_3$ could comprise a peak detector and a duty cycle detector, both receiving $S_3$ and the volume detector output comprising the peak detector output modified according to the duty cycle detector output.

It should also be noted that various types of substantially triangular waves may be used in the FIGS. 2a and 3 implementations. For instance, in place of the substantially symmetrical triangular wave illustrated in FIG. 2a, a sawtooth triangular wave may be employed. Also a rounded triangular or sinusoid-like wave could be employed but with some loss in linearity of gain vs. control voltage. Other substantially periodic and continuous waves may be employed.

Thus while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. For use with an amplitude varying signal which contains intelligence in its amplitude variations, a compressor comprising:

variable gain first means for receiving said amplitude varying signal and comprising (i) modulation means, responsive to said amplitude varying signal and a feedback signal, for outputting a signal comprising a train of pulses whose widths and heights are controlled, respectively, by said amplitude varying signal and said feedback signal, and (ii) demodulation means for converting said modulation means output signal into an amplitude varying, compressor output signal having a smaller range of amplitude variations than said amplitude varying signal, and feedback second means for developing said feedback signal in response to input received from said first means, said feedback signal being appropriate for controlling the modulation means output signal pulse heights so as to effect in said first means gain change appropriate to reduce the range of amplitude variations in said compressor output signal relative to the range of amplitude variations in said amplitude varying signal, said modulation means comprising (a) comparator means for receiving said amplitude varying signal and a substantially triangular waveform, and for outputting a pulse width modulated signal and (b) pulse height control means responsive to said feedback signal for converting said comparator means output signal into said modulation means output signal.

* * * * *